United States Patent
Xue et al.

(10) Patent No.: US 8,933,518 B2
(45) Date of Patent: Jan. 13, 2015

(54) STACKED POWER SEMICONDUCTOR DEVICE USING DUAL LEAD FRAME

(71) Applicants: Yan Xun Xue, Los Gatos, CA (US); Yueh-Se Ho, Sunnyvale, CA (US); Lei Shi, Songjiang (CN); Jun Lu, San Jose, CA (US); Liang Zhao, Songjiang (CN)

(72) Inventors: Yan Xun Xue, Los Gatos, CA (US); Yueh-Se Ho, Sunnyvale, CA (US); Lei Shi, Songjiang (CN); Jun Lu, San Jose, CA (US); Liang Zhao, Songjiang (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/734,201

(22) Filed: Jan. 4, 2013

(65) Prior Publication Data

US 2014/0191334 A1 Jul. 10, 2014

(51) Int. Cl.
*H01L 23/495* (2006.01)
*H01L 27/088* (2006.01)
*H01L 23/00* (2006.01)

(52) U.S. Cl.
CPC ........ *H01L 23/49575* (2013.01); *H01L 27/088* (2013.01); *H01L 23/49524* (2013.01); *H01L 23/49537* (2013.01); *H01L 23/49562* (2013.01); *H01L 24/34* (2013.01); *H01L 2224/48091* (2013.01); *H01L 2224/48247* (2013.01)

USPC ............................ 257/401; 438/284; 438/286

(58) Field of Classification Search
CPC ............ H01L 29/66795; H01L 29/785; H01L 29/4238; H01L 27/0207; H01L 29/0696
USPC .......... 257/676–677, 726–727, 776; 438/284, 438/286, 107–110, 117–118
See application file for complete search history.

(56) References Cited

U.S. PATENT DOCUMENTS

| | | | |
|---|---|---|---|
| 7,271,477 B2 * | 9/2007 | Saito et al. | 257/686 |
| 7,541,681 B2 * | 6/2009 | Otremba | 257/781 |
| 7,786,558 B2 * | 8/2010 | Otremba | 257/678 |
| 8,581,376 B2 * | 11/2013 | Yilmaz et al. | 257/676 |
| 2002/0093094 A1 * | 7/2002 | Takagawa et al. | 257/723 |
| 2007/0145582 A1 * | 6/2007 | Otremba | 257/728 |
| 2007/0262346 A1 * | 11/2007 | Otremba et al. | 257/177 |
| 2012/0326287 A1 * | 12/2012 | Joshi et al. | 257/676 |

* cited by examiner

*Primary Examiner* — Steven Loke
*Assistant Examiner* — Didarul Mazumder
(74) *Attorney, Agent, or Firm* — Chein-Hwa Tsao; CH Emily LLC

(57) ABSTRACT

A stacked power semiconductor device includes vertical metal oxide semiconductor field-effect transistors and dual lead frames packaged with flip-chip technology. In the method of manufacturing the stacked power semiconductor device, a first semiconductor chip is flip chip mounted on the first lead frame. A mounting clips is connected to the electrode at back side of the first semiconductor chip. A second semiconductor chip is mounted on the second lead frame, which is then flipped and stacked on the mounting clip.

7 Claims, 8 Drawing Sheets

STACKED POWER SEMICONDUCTOR DEVICE USING DUAL LEAD FRAME

CROSS REFERENCE TO RELATED APPLICATIONS

This application is a divisional application of a pending U.S. patent application entitled "STACKED POWER SEMICONDUCTOR DEVICE USING DUAL LEAD FRAME AND MANUFACTURING METHOD" application Ser. No. 13/118,445 filing date: May 29, 2011, inventor Yan Xun Xue et al. The above contents are incorporated herein by reference for any and all purposes.

FIELD OF THE INVENTIONS

The invention relates to a flip-chip power semiconductor device and manufacturing method, more specifically, relates to a stacked power semiconductor device containing metal oxide semiconductor field effect transistors (MOSFETs) with dual lead frame.

BACKGROUND ART

With the development of conventional manufacturing technologies of integrated circuit and trend of minimizing semiconductor device size, heat dissipation of devices plays an important role in improvement of semiconductor device performance. Making a minimum size package that contains semiconductor chips with maximum size is a challenge for the semiconductor industry. In a power semiconductor device, for example the DC-DC converter, high side (HS) and low side (LS) transistors are usually packaged in the same package.

Usually, in a manufacturing process of semiconductor, especially in the packaging process, various heat dissipation modes are designed depending on the device's size to improve the device performance. FIG. 1 and FIG. 2A-2E are schematic diagrams illustrating a stacked power semiconductor device in prior art. Specifically, FIG. 1 is a top view of a semiconductor package 100 and FIGS. 2A-2C are cross sectional views of package 100 in FIG. 1 along A-A line, B-B line, and C-C line respectively. As shown in FIG. 1, a first and second top bases 101a and 101b of a top lead frame are electrically connected to first and second electrodes at the front side of a first semiconductor chip 111. The first and second top bases 101a and 101b are used for heat dissipation and also used to connect the electrodes of the first semiconductor chip 111 to the outside electrical components. First and second bases 102a and 102b of a middle lead frame in FIGS. 2B-2C are located under the first semiconductor chip 111 with the second base 102a electrically connected to a portion of an electrode at the back side of the first semiconductor chip 111. First and second bases 102a and 102b are also electrically connected to a first and second electrodes at the front side of a second semiconductor chip 112, while an electrode at the back side of the second semiconductor chip 112 is connected to a bottom lead frame 103 that is used to connect the bottom electrode of the second semiconductor chip 112 to outside electrical components and also used for heat dissipation. FIG. 2E is a bottom-view schematic diagram of the package 100 with pins 103a, 103b, 103c and 103d distributed around the bottom lead frame 103 and pin 103a connected to the bottom lead frame 103.

Refer to FIG. 2C, pins 103b and 103d are respectively connected to the first and second base 101a and 101b by the extending parts 103e and 103f extending upward and approximately close to the plane of the base 102a. For the clarity, the welding material that connects the electrode of the first semiconductor chip 111 to the bases 101a, 101b and 102a and connects the electrode of the second semiconductor chip 112 to the bases 102a, 102b and 103a are not presented in the FIGS. 2A-2C.

In addition, the bases 101a and 101b have different heights, i.e., the top portions of the bases 101a and 101b are not in the same plane, as shown in FIG. 2C. Therefore, the second base 101b is plastically covered by a molding compound, while the top surface of the first base 101a is exposed out of the molding compound of the package 100. In FIG. 2B, in order to prevent the second base 102b from contacting the back side of the first semiconductor chip 111, the second base 102b is located below the first base 102a.

However, the thermal and electrical properties of the power device of the prior art as described above are not optimized, particularly for the vertical semiconductor devices. As such, various embodiments of the present invention are proposed to obtain a semiconductor package with minimum package size and maximum semiconductor chip size.

BRIEF DESCRIPTION OF DRAWINGS

The drawings describe the embodiment of the invention more sufficiently. However, the drawings are only used for specification and description, and cannot restrict the scope of the invention.

DETAILED DESCRIPTION OF THE INVENTION

Figure 1:
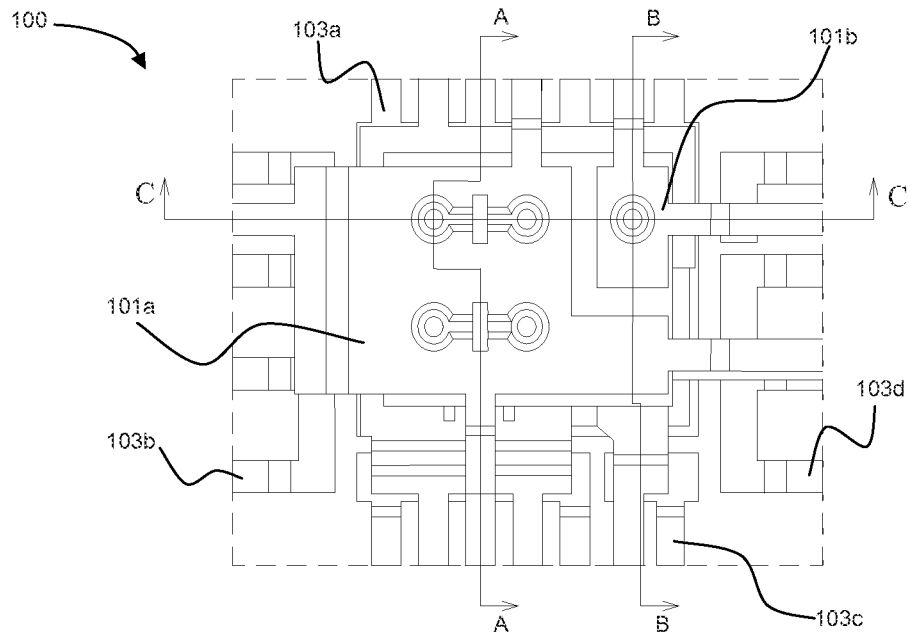
FIG. 1 is a top view schematic diagram illustrating a stacked semiconductor device of prior art.
Figure 2A:
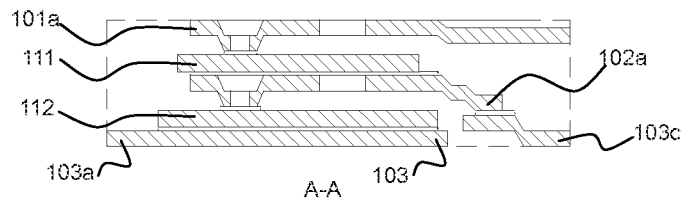
FIG. 2A is a cross-sectional schematic diagram of the stacked semiconductor device of FIG. 1 along A-A line.
Figure 2B:
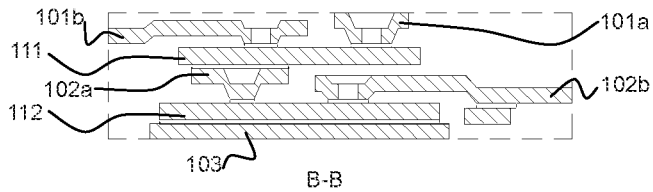
FIG. 2B is a cross sectional schematic diagram of the stacked semiconductor device of FIG. 1 along B-B line.
Figure 2C:
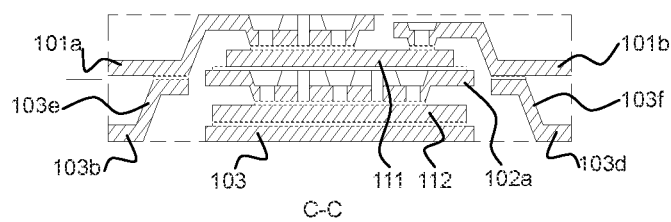
FIG. 2C is a cross-sectional schematic diagram of the stacked semiconductor device along C-C line.
Figure 2D:
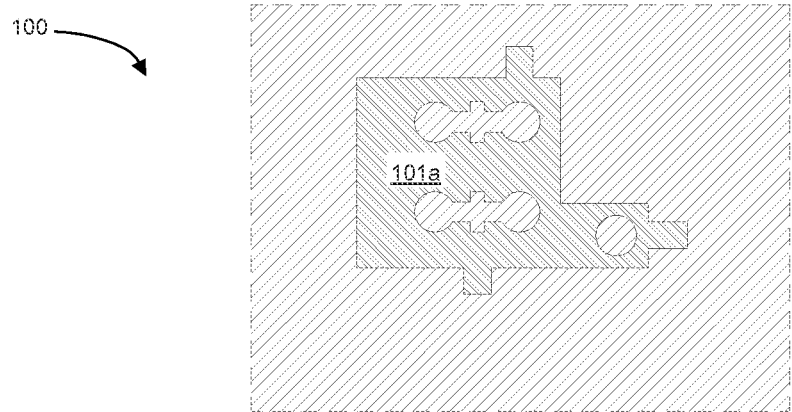
FIG. 2D is a top view schematic diagram of the stacked semiconductor device of FIG. 1 covered with a molding compound.
Figure 2E:
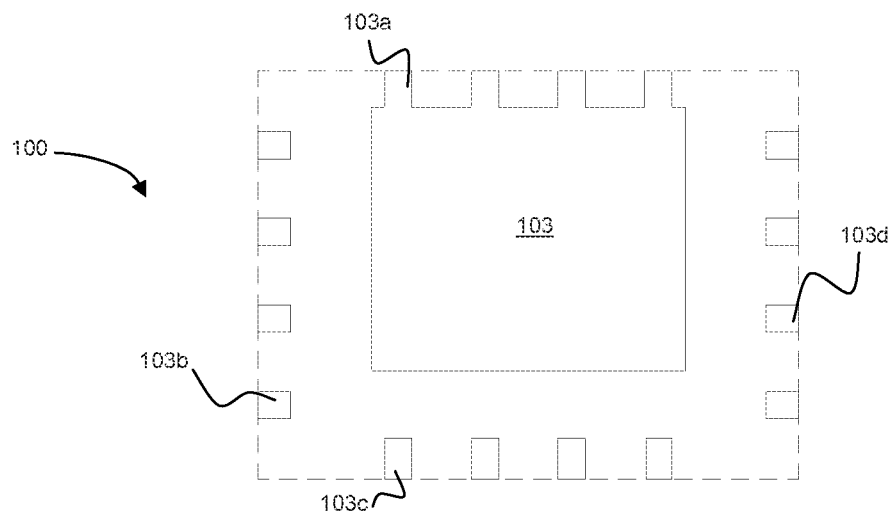
FIG. 2E is a bottom-view schematic diagram of the stacked semiconductor device of FIG. 1.
Figure 3A:
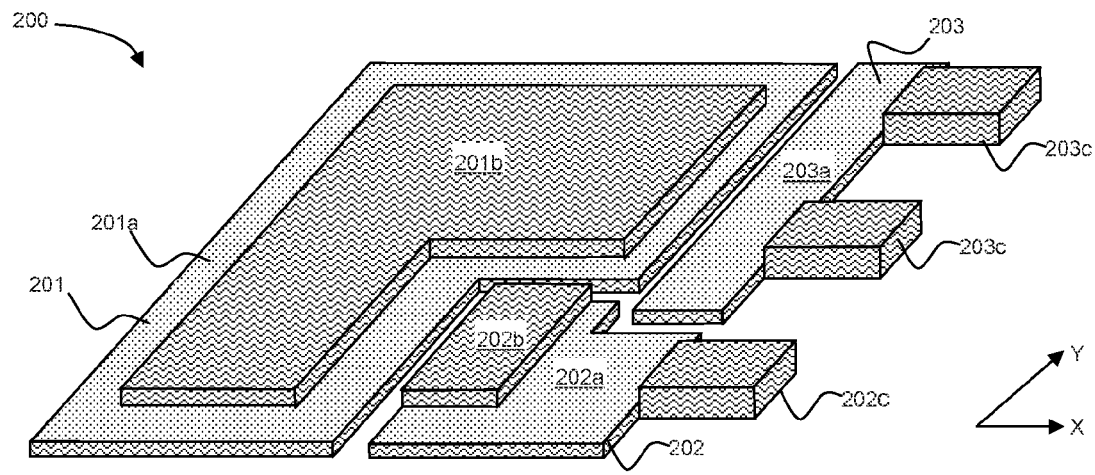
FIG. 3A is a three-dimensional schematic diagram of a bottom lead frame of the stacked power semiconductor device in present invention.
Figure 3B:
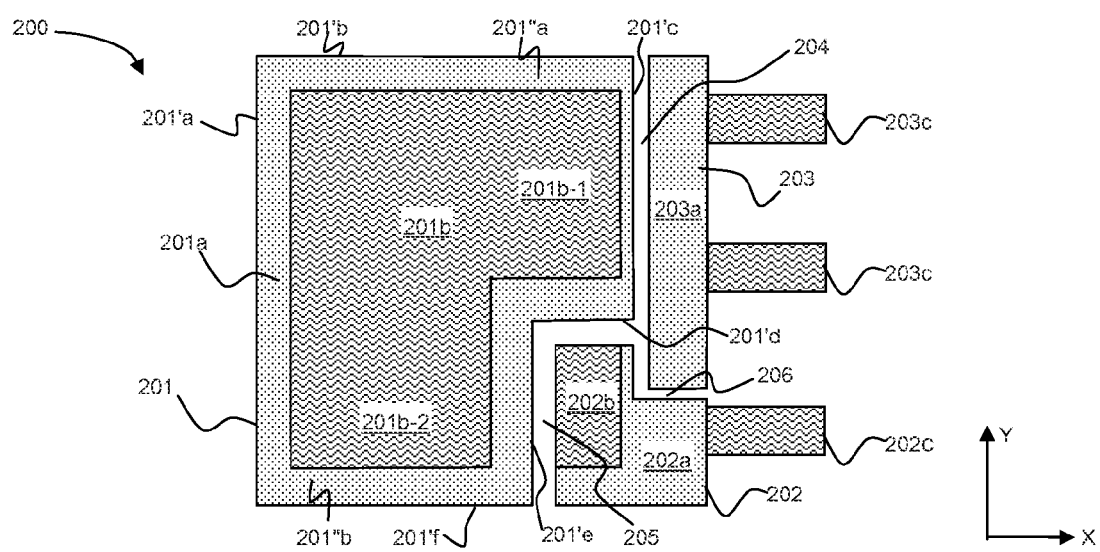
FIG. 3B is top view schematic diagram of the bottom lead frame in FIG. 3A.
Figure 3C:
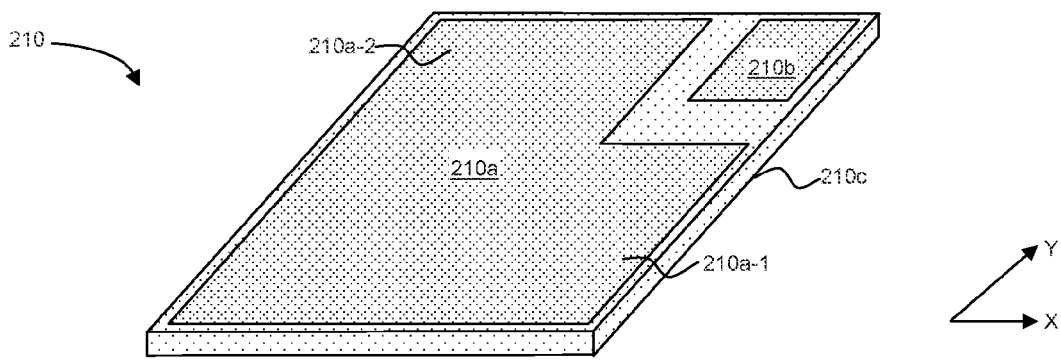
FIG. 3C is a three-dimensional schematic diagram of a first semiconductor chip.
Figure 3D:
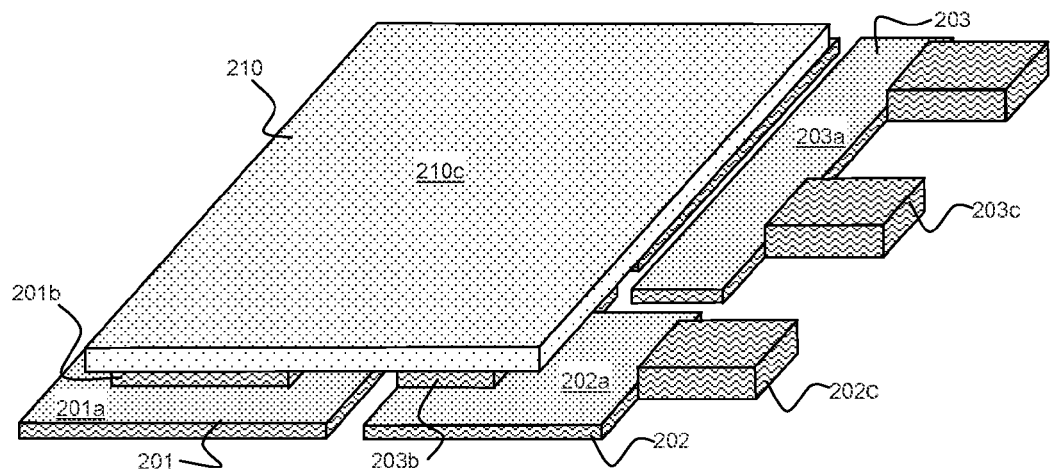
FIG. 3D is a three-dimensional schematic diagram illustrating the first semiconductor chip flip-chip attacked on the first and second bases of the bottom lead frame.
Figure 3E:
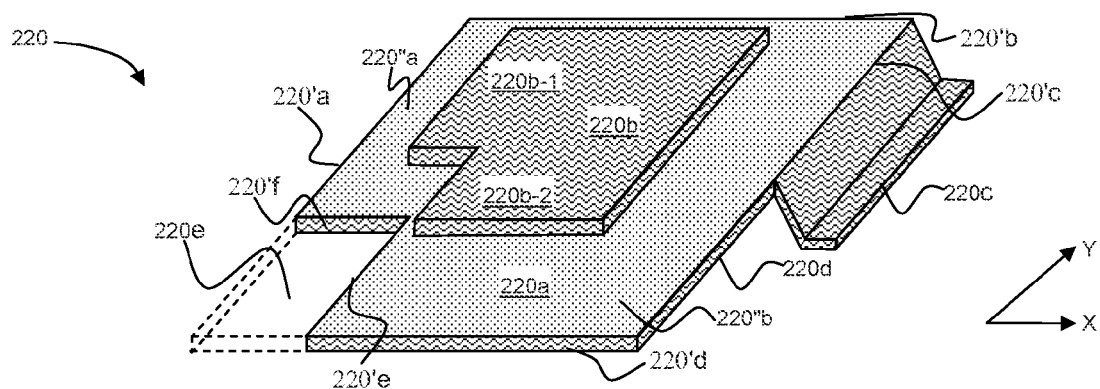
FIG. 3E is a three-dimensional schematic diagram of a mounting clip in present invention.
Figure 3F:
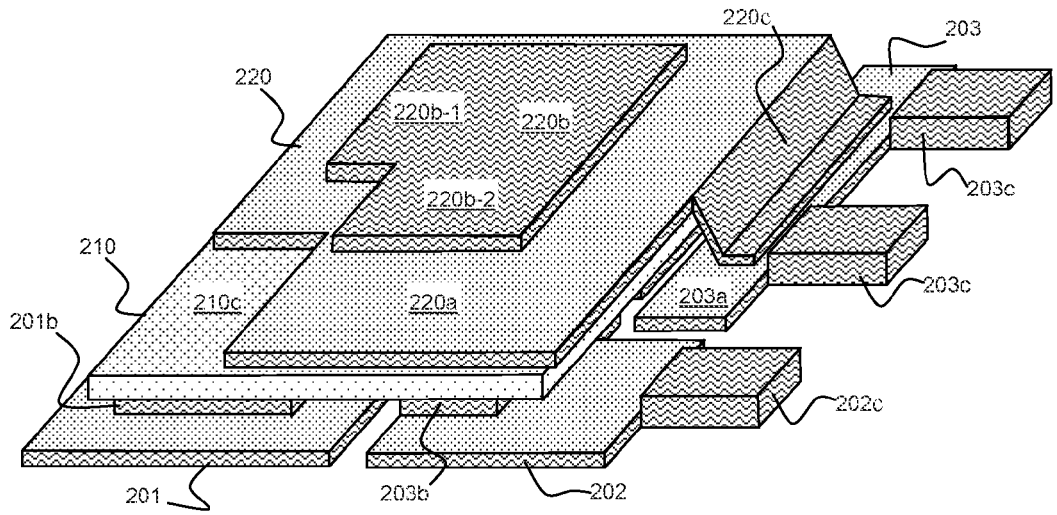
FIG. 3F is a three-dimensional schematic diagram illustrating the mounting clip stacked on top of the first semiconductor chip.
Figure 3G:
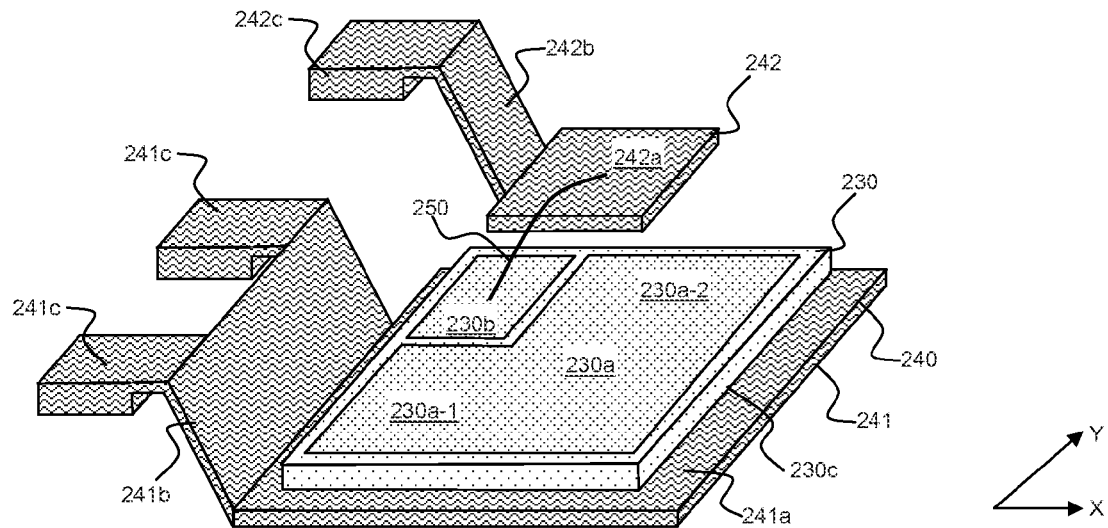
FIG. 3G is a three-dimensional schematic diagram illustrating a second semiconductor chip connected on a top lead frame.
Figure 3H:
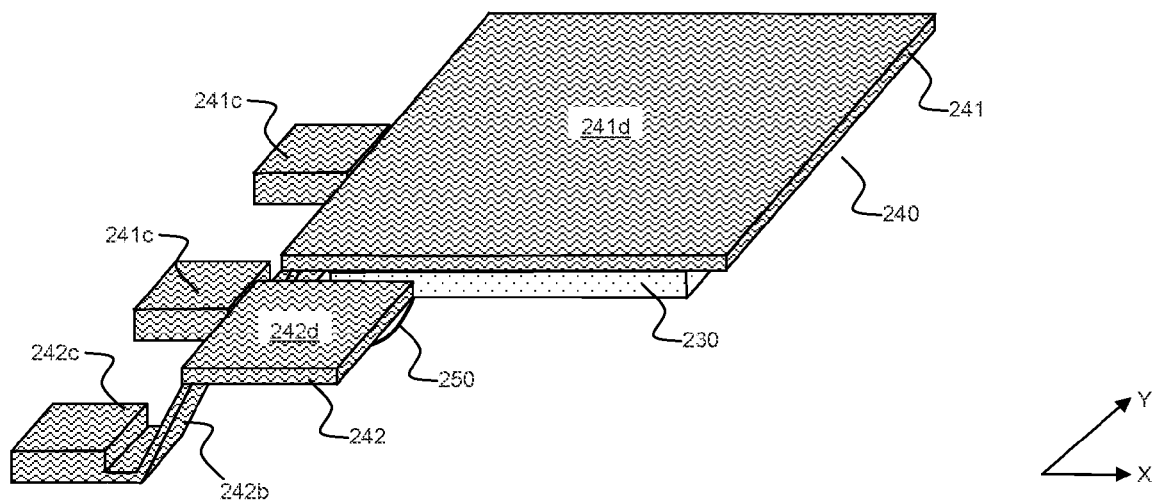
FIG. 3H is a three-dimensional schematic diagram illustrating the flipped top lead frame with the second semiconductor chip of FIG. 3G.
Figure 3I:
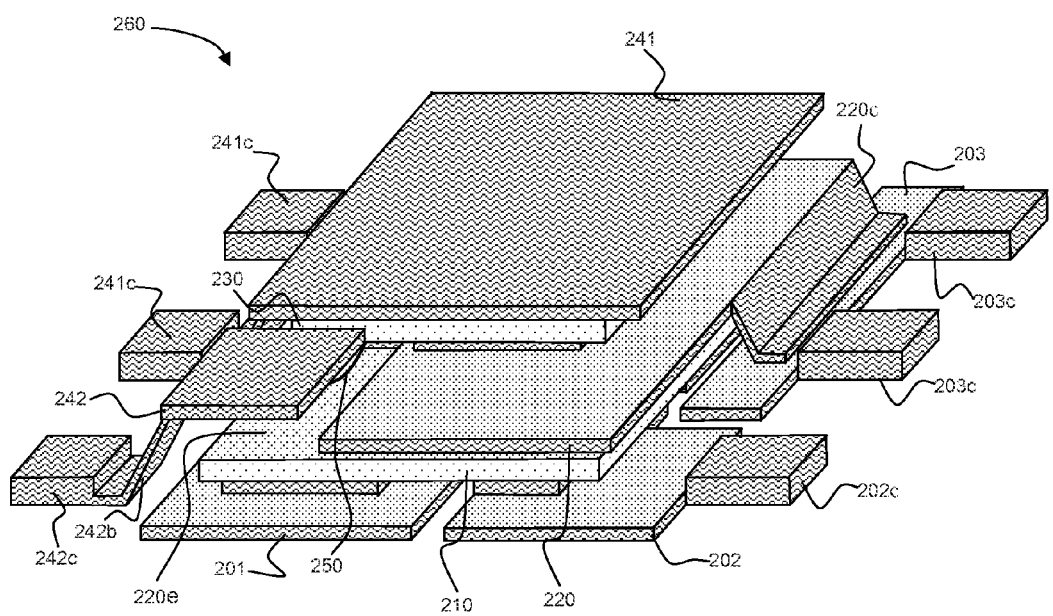
FIG. 3I is a three-dimensional schematic diagram illustrating an overall structure of the stacked power semiconductor device of present invention.

FIG. 3I is a three-dimensional schematic diagram of a stacked power semiconductor device 260 of the present invention. As shown in FIG. 3I, a bottom lead frame 200 includes a first bottom base 201, a second bottom base 202 and a third bottom base 203 with the second bottom base 202 and the third bottom base 203 arranged close to the first bottom base 201 and separated from the first bottom base 201. The first semiconductor chip 210 is flip-chip attached on the bottom lead frame 200. Specifically, a first electrode at the front side of the first semiconductor chip 210 is connected to the first bottom base 201 and a second electrode at the front side of the first semiconductor chip 210 is connected to the second bottom base 202. A mounting clip 220 is stacked on top of the first semiconductor chip 210 and electrically connected to a third electrode at the back side of the first semiconductor chip 210. The mounting clip 220 also includes an extending part 220c bending downward and connecting to the third bottom base 203. Alternatively, the bottom lead frame 200 may not have the third bottom base 203 and the extending part 220c of the mounting clip 220 may extend further down having a bottom surface coplanar to the bottom surface of the bottom lead frame 200.

A top lead frame 240 includes a first top base 241 and a second top base 242 adjacent to and separated from the first top base 241. The second semiconductor chip 230 is flip-chip attached on the mounting clip 220 with its first electrode at its front side connected to the mounting clip 220. The first top base 241 is connected to the second semiconductor chip 230 and electrically connected to a third electrode at the back side of the second semiconductor chip 230. A cut-off area 220e on the mounting clip 220 forms a gap between the second top base 242 and the first semiconductor chip 210. A second electrode at the front side of the second semiconductor chip 230 is positioned beyond an edge of the mounting clip 220 for electrically connecting to the bottom surface 242a of the second top base 242 by a bonding wire 250 with the bonding wire 250 located inside the cut-off area 220e. The mounting clip 220 may be provided with various shapes but is preferred in L-shape for maximizing the contact to the first electrode of the second semiconductor chip. In FIG. 3I, the first top base 241 and second top base 242 also include extending parts 241b and 242b respectively (which is not shown in FIG. 3I) bending downward and extending to the plane of the bottom lead frame 200. The downward extending parts 241b and 242b of the first and second top bases are disposed on one side of the package while the downward extending part 220c of the mounting clip 220 is disposed on an opposite side of the package. Alternatively the bottom lead frame may further comprise a fourth and a fifth bottom bases disposed along a side of the first bottom base opposite to the second and third bottom bases and the downward extending parts 241b and 242b may extend and connect to the fourth and fifth bottom bases respectively. In the embodiment shown, a plurality of pins 241c are connected to the bottom end of the extending parts 241b. A pin 242c is connected to the bottom end of the extending part 242b. A pin 202c is connected to the second bottom base 202, and a plurality of pins 203c are connected to the third bottom base 203. Because the extending parts 241b and 242b extend to the plane of the bottom lead frame 200, the pins 241c, 242c, the bottom lead frame 200 and the pins 202c and 203c are coplanar, which provides good reliability for installing the stacked power semiconductor device 260 on the PCB circuit board using SMT technology.

A plastic molding compound is used to encapsulate the bottom lead frame 200, mounting clip 220, bonding wire 250, top lead frame 240, first semiconductor chip 210 and second semiconductor chip 230 of the stacked power semiconductor device 260. For clarity, the plastic molding compound is not shown in the FIG. 3I. The bottom surfaces of the first bottom base 201, the second bottom base 202 and the third bottom base 203 and the bottom surfaces of the pins 241c, 242c, 202c and 203c are exposed so that they can be used as terminals for connecting with the outside electrical components and also for heat dissipation. The first top base 241 and the second top base 242 may be exposed or covered by the plastic molding compound depending on the device application.

The stacked power semiconductor device 260 in FIG. 3I is described in detail referring to FIGS. 3A-3H. In FIG. 3A, the bottom lead frame 200 includes a first bottom base 201, a second bottom base 202 and a third bottom base 203 arranged close to and separated from the first bottom base 201. The first bottom base 201 is substantially an L-shaped structure, as shown in FIG. 3B, which is enclosed by edges 201'a, 201'b, 201'c, 201'd, 201'e and 201'f. The third bottom base 203 is close to and extends along the edge 201'c. The second bottom base 202 is arranged at the L-shaped corner of the first bottom base 201 and along the edges 201'd and 201'e. The first bottom base 201, the second bottom base 202 and the third bottom base 203 are first formed in the same piece, then are separated by cutting along slot 205 between the second bottom base 202 and the first bottom base 201, along slot 204 between the third bottom base 203, the first bottom base 201 and second bottom base 202, and along slot 206 between the second bottom base 202 and the third bottom base 203. In addition, in FIG. 3A, a first pad 201b is formed on a top surface 201a of the first bottom base 201 and a second pad 202b is formed on a top surface 202a of the second bottom base 202. The first pad 201b is an L-shaped structure similar to the first base 201, which includes a first part 201b-1 corresponding to the part 201"a of the first bottom base 201, and a second part 201b-2 corresponding to the part 201"b of the first bottom base 201, as shown in FIG. 3B. The arrangement of the first bottom base 201, second bottom base 202 and third bottom base 203 of the bottom lead frame 200 as described above is only a preferred embodiment. Alternative arrangements also can be used.

FIG. 3C is a three-dimensional schematic diagram of the first semiconductor chip 210 as a vertical LS power MOSFET, which includes the first electrode 210a and second electrode 210b at a front side and the third electrode at a back side of the first semiconductor chip 210. In this case, the first electrode 210a, the second electrode 210b and the third electrode 210c are a source electrode, a gate electrode and a drain electrode respectively. The shape of the first electrode 210a is substantially an L-shaped structure and is separated with the second electrode 210b by a passivation layer. The first electrode 210a includes a first part 210a-1 and a second part 210a-2. As shown in FIG. 3D, the first semiconductor chip 210 is flip-chip attached on top of the bottom lead frame 200, with the first electrode 210a of the first semiconductor chip 210 connected to the first pad 201b at the top surface 201a of the first bottom base 201 and the second electrode 210b of the first semiconductor chip 210 connected to the second pad 202b at the top surface 202a of the second bottom base 202 using solder paste, conductive silver paste or eutectic welding technology and the likes. The L-shaped first electrode 210a should be perfectly matched with the L-shaped first pad 201b to keep the first electrode 210a in a good electrical contact with the first pad 201b and to prevent the first electrode 210a in electrical contact with other parts of the first lead frame 200 if any small offset occurs during flip-chip connecting process. Preferably, the size of the first pad 201b is less than the size of the first electrode 210a. Alternatively, the first pad 201b and the second pad 202b can be replaced by other connecting structures, such as solder bumps.

FIG. 3E is a three-dimensional schematic diagram of the mounting clip 220. The mounting clip 220 is also an L-shaped structure, which includes an extending part 220c bending downward, as shown in FIG. 3E. The L-shaped structure of the mounting clip 220 is enclosed by edges 220'a, 220'b, 220'c, 220'd, 220'e and 220'f. The first part 220"a of the mounting clip 220 is between the edge 220'b and the edge 220'f, and the second part 220"b of the mounting clip 220 is between the edge 220'c and the edge 220'e. The L corner of the mounting clip 220 is in an opposite direction with the L corner of the bottom lead frame 200 or the first pad 201b as shown in FIGS. 3A and 3E. The mounting clip 220 also includes a cut-off area 220e at its L corner along the edge 220'e and the edge 220'f. The extending structure 220c is arranged along the edge 220'c. A third pad 220b is formed on the top surface 220a of the mounting clip 220, which also is an L-shaped structure similar to the mounting clip 220 and including a first part 220b-1 and a second part 220b-2.

As shown in FIG. 3F, the mounting clip 220 is stacked on the first semiconductor chip 210 with the bottom surface 220d of the mounting clip 220 is connected to the third electrode 210c at the back side of the first semiconductor chip 210 using solder paste, conductive silver paste or other type of welding technology. During this process, the extending structure 220c locates on the top surface 203a of the third bottom base 203 and is connected to the third bottom base 203 using solder paste, conductive silver paste or other types of welding technology.

As shown in FIG. 3G, the second semiconductor chip 230, which is also a vertical HS power MOSFET, includes a first electrode 230a and a second electrode 230b at the front side of the second semiconductor chip 230, and a third electrode at the back side of the second semiconductor chip 230. The first electrode 230a is substantially an L-shaped structure and is separated from the second electrode 230b by a passivation layer. For a HS power MOSFET, the first electrode 230a, the second electrode 230b and the third electrode 230c are source electrode, gate electrode and drain electrode respectively. The first electrode 230a includes a first part 230a-1 and a second part 230a-2.

As shown in FIG. 3G, the second semiconductor chip 230 is mounted on a top lead frame 240, which also includes a first top base 241 and a second top base 242 preferably formed in the same plane and separated from each other. Specifically, the third electrode 230c of the second semiconductor chip 230 is connected on the bottom surface 241a of the first top base 241 using solder paste, conductive silver paste or eutectic welding technology or the likes. The second electrode 230b of the second semiconductor chip 230 is electrically connected to the bottom surface 242a of the second top base 242 using a metal conductor, such as the bonding wire 250.

FIG. 3H shows the flip over of top lead frame 240 with the connected second semiconductor chip 230 assembly of FIG. 3G. The flipped second semiconductor chip 230 is stacked on top of the mounting clip 220 with the first electrode 230a matched with the third pad 220b in shape (i.e., the first part 230a-1 of the first electrode 230a is directly over the first part 220b-1 of pad 220b, and the second part 220a-2 of the first electrode 230a is directly over the second part 220b-2 of pad 220b), as shown in FIGS. 3F-3I, to keep good electric contact between the first electrode 230a and the third pad 220b and prevent the first electrode 230 in contact to other parts of the mounting clip 220 if any small offset occurs during the flip-chip bonding process of the second semiconductor chip 230 and the top lead frame 240. The third pad 220b is preferably smaller than the first electrode 230a. The first electrode 230a can be connected to the third pad 220b using solder paste, conductive silver paste or eutectic welding technology and the likes. In another embodiment, the third pad 220b can be replaced with other connecting structures, such as solder bumps preformed on the semiconductor chip electrodes.

After the second semiconductor chip 230 and the top lead frame 240 are flipped and connected to the mounting clip 220, a portion of the second electrode 230b at the front side of the second semiconductor chip 230 and the second top base 242 locate above the cut-off area 220e. Due to the flip over of the second chip 230 and the top lead frame 240, the surfaces 241a and 242a of the first top base 241 and the second top base 242 are downwards, while respective top surface 241d and 242d are upwards. The second electrode 230b of the second semiconductor chip 230 locates above the cut-off area 220e, which avoids the second electrode 230b from being blocked by the mounting clip 220 in electrical connection to the bottom surface 242a of the second top base 242 by the bonding wire 250 (see FIGS. 3G-3I). The cut-off area 220e, therefore, is used for housing the bonding wire 250, which can prevent the bonding wire 250 from contacting other components of the device that may cause a short-circuit. Alternatively, the bonding wire 250 also can be replaced by other metal conductors, such as metal band, sheet metal and the likes.

As shown in FIG. 3G, the first and second top bases 241 and 242 also include extending structures 241b and 242b respectively bending upward. After the top lead frame 240 with the second semiconductor chip 230 shown in FIG. 3G is flipped in the subsequent process, as shown in FIG. 3H and FIG. 3I, the extending structure 241b (not shown) of the first top base 241 and the extending structure 242b of the second top base 242 become bending downward. The bottom lead frame 200 and the pins 241c and 242c connected to the extending structures 241b and 242b respectively therefore locate in a same plane with the pins 202c and 203c connected to the second bottom base 202 and the third bottom base 203.

Figure 4A:
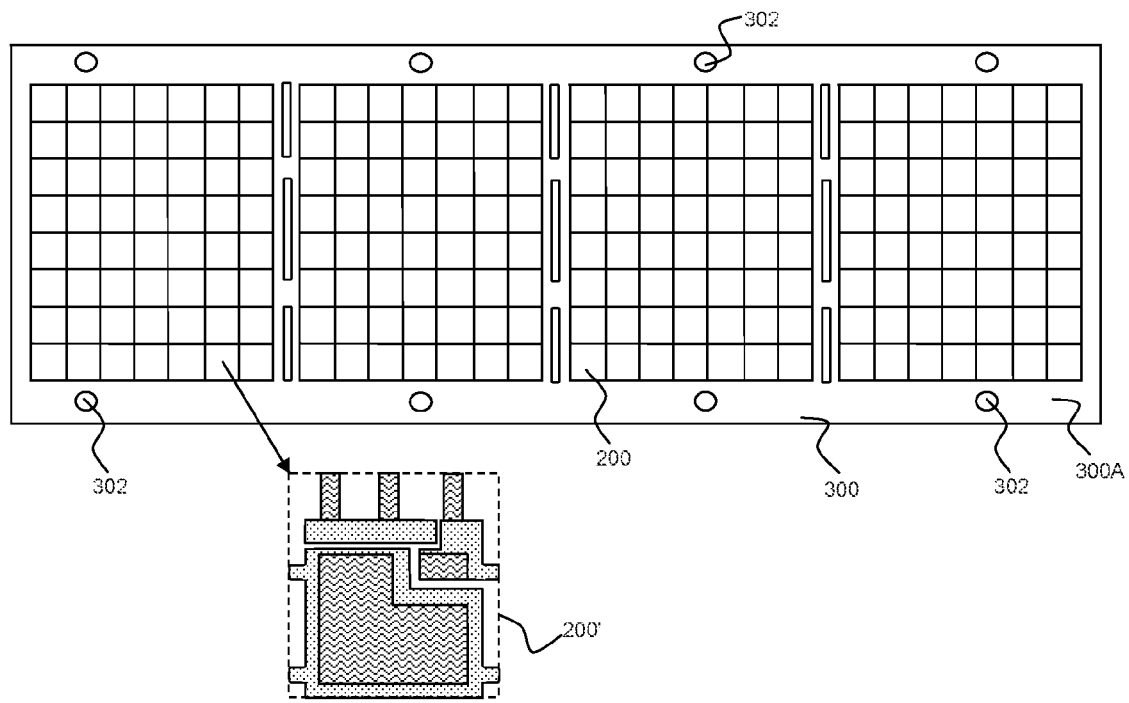
FIG. 4A are top view schematic diagrams of the first lead frame array including multiple bottom lead frames and an enlarged image of each bottom lead frame.

FIGS. 4A-4D illustrate a preferred manufacturing method of stacked power semiconductor device 260 of FIG. 3I. FIG. 4A is a top view schematic diagram illustrating a first lead frame array 300 that includes a front side 300A, a backside 300B (not shown), a plurality of positioning holes 302 on the edges of the first lead frame array 300 and a plurality of bottom lead frames 200 of the type described above in FIGS. 3A and 3B. An enlarged image 200' of a bottom lead frame 200 is also shown in FIG. 4A.

Figure 4B:
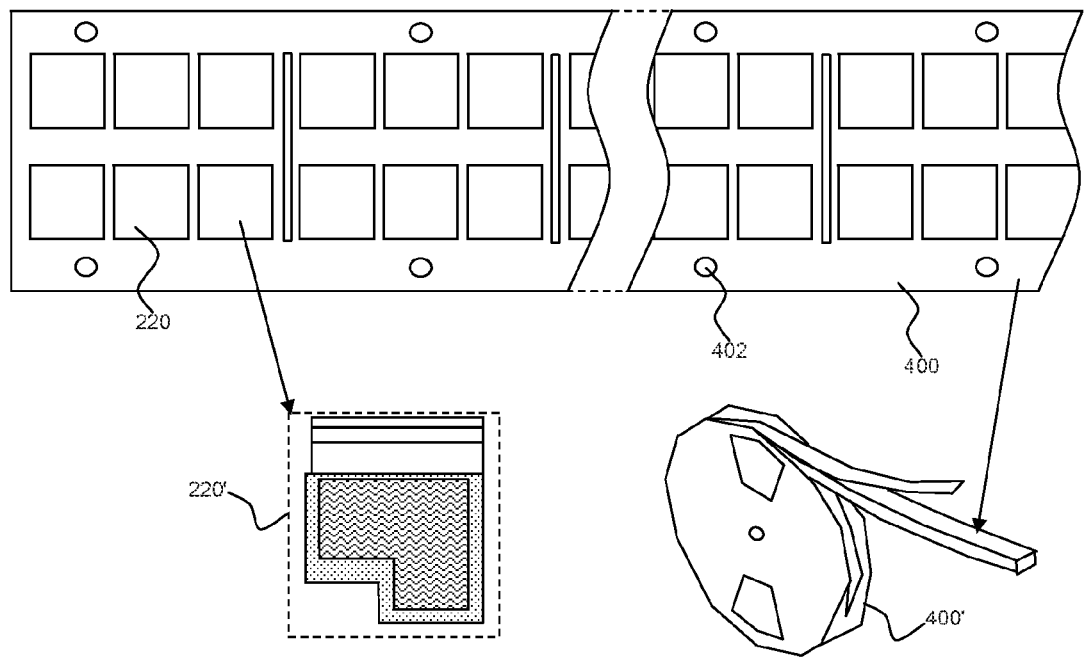
FIG. 4B are schematic diagrams of a top view of a mounting clip frame array including multiple mounting clips, a top view of an enlarged mounting clip and a perspective view of a roll of the mounting clip frame array.

FIG. 4B shows a mounting clip frame array 400, which is wound to form the mounting clip roll 400'. The mounting clip frame array 400 includes a plurality of mounting clips 220 of the type described above in FIG. 3E and a plurality of positioning holes 402 on the edges of the mounting clip frame array 400. An enlarge image 220' of the mounting clip 220 is also shown in FIG. 4B.

Figure 4C:
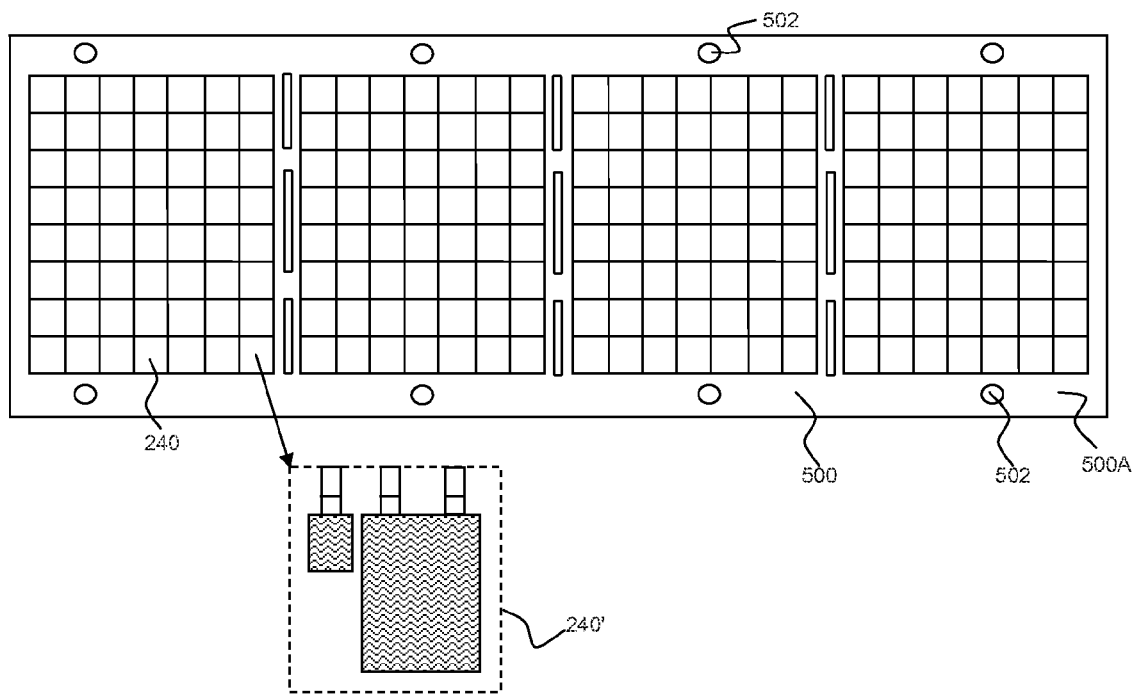
FIG. 4C are top view schematic diagrams of the second lead frame array including multiple top lead frames and an enlarged image of each top lead frame.

Similarly, FIG. 4C shows a second lead frame array 500 that includes a front side 500A, a back side 500B (not shown), a plurality of positioning holes 502 on the edges of the second lead frame array 500, and a plurality of top lead frames 240 of the type described above in FIGS. 3G and 3H. An enlarged image 240' of the top lead frame 240 is also shown in FIG. 4C. A plurality of first semiconductor chips 210 of the type described above in FIG. 3C are flip-chip attached on the multiple bottom lead frames 200 of the first lead frame array 300 one by one, as shown in FIG. 3D, with the first pad 201b and the second pad 202b of the bottom lead frame 200 connected to the first electrode 210a and the second electrode 210b at the front side of the first semiconductor chip 210.

Multiple mounting clips 220 of the mounting clip frame array 400 are aligned and stacked on the back side of the multiple first semiconductor chips 210 one by one, as shown in FIG. 3F. The process of connecting a mounting clip to the back side of a semiconductor chip is well known in the art.

As described above, the mounting clip 220 includes an extending structure 220c bending downward. As the multiple mounting clips 220 are stacked on the multiple first semiconductor chips 210, the bottom surface 220d of the mounting clip 220 is connected to the back side of the first semiconductor chip 210, specifically connected to the third electrode 210c of the first semiconductor chip 210, with the extending structure 220c extending and connected to the top surface 203a of the third bottom base 203 of the bottom lead frame 200.

Multiple second semiconductor chips 230 are stacked on the multiple top lead frames 240 of the second lead frame 500 one by one, as shown in FIG. 3G. Refer to FIGS. 3G-3H, the top lead frame 240 includes a first top base 241 and a second top base 242 separated and located in the same plane. The third electrodes 230c at the back side of the multiple second semiconductor chips 230 are connected on the bottom surface 241a of the first top base 241 of the multiple top lead frames 240 of the second lead frame 500. The second electrode 230b at the front side of the semiconductor chip 230 is electrically connected to the bottom surface 242a of the second base 242 adjacent to the first top base 241 by a bonding wire 250.

Figure 4D:
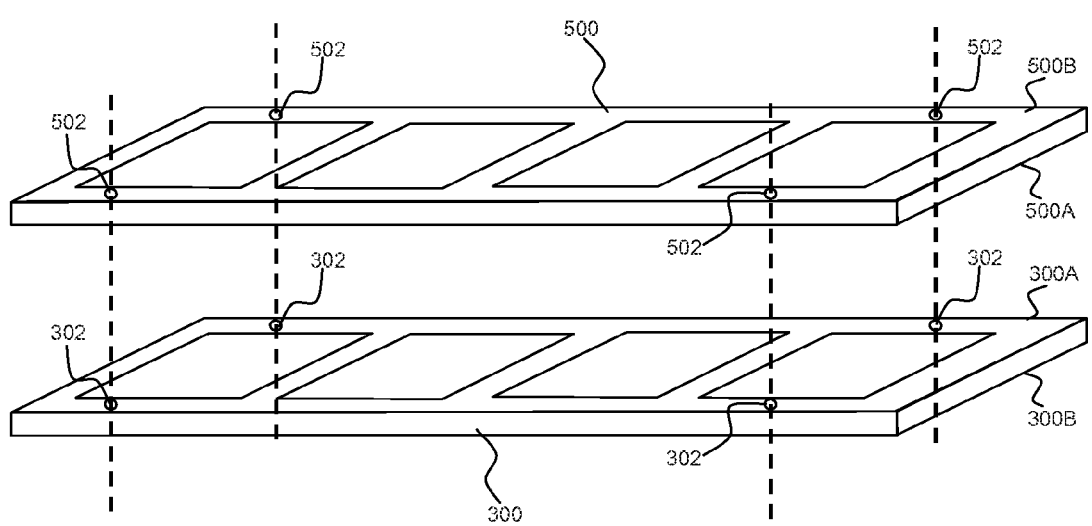
FIG. 4D is a three-dimensional schematic diagram illustrating the flipped second lead frame array positioning above the first lead frame array for alignment of the second lead frame array on top of the first lead frame array through positioning holes.

As shown in FIG. 4D, the second lead frame array 500 is then flipped over, with the front 500A of the second lead frame array 500 facing downward, and the back side 500B of the second lead frame facing upward. The flipped second lead frame array 500 is then aligned and positioned above the first lead frame array 300 that has the front side 300A facing upward and the back side 300B facing downward. The front side 300A of the first lead frame array 300 is then connected to the front side 500A of the second lead frame array 500 with the first semiconductor chip 210 stacked on the front side 300A of the first lead frame array 300 and the mounting clips 220 attached on the first semiconductor chip 210.

The multiple second semiconductor chips 230 are also flipped over when the second lead frame array 500 is flipped and then are aligned to connect the first electrode 230a of the second semiconductor chip 230 to the pad 220b of the mounting clip 220. As shown in FIG. 4D the flipped second lead frame array 500 is aligned and positioned above the first lead frame array 300 such as the positioning hole 302 on the edge of the first lead frame array 300 are aligned and positioned above the positioning hole 502 on the edge of the second lead frame array 500. Self-alignment between the second lead frame array 500 and the first lead frame array 300 at vertical direction, for example, using positioning pins penetrated through the positioning holes 302 and 502 to ensure the first lead frame array 300 and the second lead frame array 500 are positioned at the correct position, can be applied. Specifically, after the first lead frame array 300, which includes the first semiconductor chips 210 and the mounting clips 220 stacked on the bottom lead frames 200, and the second lead frame array 500, which includes the second semiconductor chips 230 connected on the top lead frame 240, are unloaded on an equipment platform (the second lead frame array 500 is positioned above the first lead frame array 300), the positioning pins are placed in the positioning holes 302 and penetrate through the positioning holes 502 to correctly position the first lead frame 300 and the second lead frame array 500. Then the flipped second semiconductor chip 230 is precisely stacked on the mounting clip 220. After finishing these steps, the first lead frame array 300, the second lead frame array 500, the multiple first chips 210, the multiple mounting clips 220 and the multiple second chips 230 are connected together to form multiple non-packaged stacked power semiconductor devices 260 as shown in FIG. 3I. As the second lead frame array 500 and corresponding multiple second semiconductor chips 230 are flipped over, because the second lead frame array 500 are aligned and stacked on top the first lead frame array 300, the second semiconductor chip 230 is also aligned above the mounting clip 220 (i.e., the first electrode 230a of the second semiconductor chip 230 is aligned and connected to the pad 220b of the mounting clip 220). A portion of the second electrode 230b at the front side of the second semiconductor chip 230 and the bottom surface 242a of the second top base 242 are positioned above the cut-off area 220e (as shown in FIGS. 3E-3I) and the bonding wire 250 is located inside the cut-off area 220e, which prevent the second electrode 230b, the bonding wire 250 and the bottom surface 242a of the second top base 242 from being contacted (or covered) by other components of the mounting clip 220, thereby avoiding short circuit. In addition, the cut-off area 220e can also be used for housing the bonding wire 250.

Referring to FIGS. 3F-3I, after the second lead frame array 500 and corresponding multiple second semiconductor chips 230 are flipped, the extending structure 241b of the first top base 241 and the extending structure 242b of the second top base 242 become bending downward and extend to the plane of the bottom lead frame 200 and the pins 241c and 242c, which are connected to the extending structure 241b and the extending structure 242b, locate in a same plane with the pins 202c and 203c, which are connected to the second bottom base 202 and the third bottom base 203 of the bottom lead frame 200.

Finally a molding compound (not shown) is used to encapsulate the first lead frame array 300 with the multiple first semiconductor chips 210 connected to the bottom lead frame 200 of the first lead frame array 300, multiple mounting clips 220 connected on multiple first semiconductor chips 210, a second lead frame array 500 with multiple second semiconductor chips 230 stacked on the top lead frame 240 of the second lead frame array 500, and the bonding wire 250. The molding compound, first lead frame array 300 and the second lead frame array 500 are then cut to separate individual packaged stacked power semiconductor 260 (as shown in FIG. 3I) from the molding compound, the first lead frame array 300 and the second lead frame array 500. If it is required to expose the top surface 241d of the first top base 241 and the top surface 242d of the second top base 242 of the packaged stacked power semiconductor device 260, which are located on the back side 500B of the second lead frame array 500, from molding compound, the back side 500B of the second lead frame array 500 can be selected to not be covered by the molding compound. Otherwise, the back side 500B of the second lead frame array 500 is fully covered by the molding compound after being packaged.

Above method is also available if using other types of connecting structures, such as solder bumps, to replace the first pad 201b and the second pad 202b, and the first semiconductor chip 210 can be flip-chip attached on the bottom lead frame 200 by using the solder bumps to connect the first electrode 210a of the first semiconductor chip 210 on the top surface 201a of the first bottom base 201 the second electrode 210b of the first semiconductor chip 210 on the top surface 202a of the second bottom base 202. The second pad 202b formed on the top surface 202a of the second bottom base 202 may also be replaced by other connecting structures.

Typical embodiments of special structures in specific mode for carrying out the invention are given out via the specifications and attached drawings, for example, this case describes the metal oxide semiconductor transistor devices, and based on the spirit of present invention, the semiconductor chips can also be any other types. Although above invention discloses current preferred embodiment, these contents are not be used as limitations.

As for the technicans in this field, after reading above speicfication, it is no doubt that they will obviously make various changes and modifications. Therefore, the attached claims shall be regarded as all of the changes and modifcations of the real purpose and range covering the present invention. Any and all of the equivalent range and content in the claims shall also be regarded as belonging to the purpose and range of the present invnetion.

The invention claimed is:

1. A stacked power semiconductor device with dual lead frame, comprising:
   a bottom lead frame comprising a first bottom base, a second and a third bottom bases adjacent to the first bottom base and separated from the first bottom base;
   a mounting clip comprising an extending part bending downward;
   a top lead frame comprising a first top base and a second top base adjacent to and separated from the first top base;
   a first semiconductor chip comprising a first electrode and a second electrode at a front side of the first semiconductor chip and a third electrode at a back side of the first semiconductor chip; and
   a second semiconductor chip comprising a first electrode and a second electrode at a front side of the second semiconductor chip and a third electrode at a back side of the second semiconductor chip;
   wherein the first semiconductor chip is flip-chip mounted on the bottom lead frame with the first and second electrodes respectively connected to the first bottom base and the second bottom base of the bottom lead frame, wherein the mounting clip is stacked on the first semiconductor chip with a bottom surface of the mounting clip connected to the third electrode located on the back side of the first semiconductor chip, with the downward extending part of the mounting clip extending to and connecting to a top surface of the third bottom base of the bottom lead frame, and
   wherein the second semiconductor chip is flip-chip mounted on a top surface of the mounting clip with the first electrode connected to the mounting clip and the second electrode extending beyond an edge of the mounting clip, wherein a bonding wire electrically connecting the second electrode of the second semiconductor chip to a bottom surface of the second top base of the top lead frame facing against the third electrode of the first semiconductor chip, wherein the second top base of the top lead frame comprises an extending part bending downwards continuously from the bottom surface of the second top base to a surface coplanar to a bottom surface of the bottom lead frame for external connection, and wherein the first top base of the top lead frame is stacked on and electrically connected to the third electrode of the second semiconductor chip.

2. The stacked power semiconductor device with dual lead flame of claim 1, wherein at least a portion of the second top base is located above and beyond the edge of the mounting clip.

3. The stacked power semiconductor device with dual lead flame of claim 1, wherein the first top base of the top lead flame comprises an extending part bending downwards, and wherein the extending parts extend to a surface coplanar to a bottom surface of the bottom lead frame.

4. The stacked power semiconductor device with dual lead flame of claim 1, wherein the first semiconductor chip is a low-side (LS) MOSFET, and the second semiconductor chip is a high-side (HS) MOSFET, and wherein the first electrode of the first and second semiconductor chips is a source electrode, the second electrode of the first and second semiconductor chips is a gate electrode, and the third electrode of the first and second semiconductor chips is a drain electrode.

5. The stacked power semiconductor device with dual lead frame of claim 3, wherein the extending part of the first top base is disposed at a first side of the stacked power semiconductor device and the extending part of the mounting clip is disposed at a second side of the stacked power semiconductor device opposite to the first side.

6. The stacked power semiconductor device with dual lead frame of claim 3, wherein the extending parts of the first and second top bases terminated at an edge of a plastic molding body encapsulating at least part of the bottom lead frame, the mounting clip, the top lead frame and the first and second semiconductor chips.

7. The stacked power semiconductor device with dual lead frame of claim 1, wherein a top surface of the first top base of the top lead frame is exposed through a top surface of the plastic molding body.

* * * * *